(12) United States Patent
Hong et al.

(10) Patent No.: US 10,490,577 B2
(45) Date of Patent: Nov. 26, 2019

(54) METHOD FOR MANUFACTURING ARRAY SUBSTRATE AND ARRAY SUBSTRATE

(71) Applicant: Wuhan China Star Optoelectronics Technology Co., Ltd., Wuhan (CN)

(72) Inventors: Guanghui Hong, Wuhan (CN); Qiang Gong, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 230 days.

(21) Appl. No.: 15/566,708

(22) PCT Filed: May 3, 2017

(86) PCT No.: PCT/CN2017/082813
§ 371 (c)(1),
(2) Date: Oct. 15, 2017

(87) PCT Pub. No.: WO2018/176566
PCT Pub. Date: Oct. 4, 2018

(65) Prior Publication Data
US 2019/0050091 A1    Feb. 14, 2019

(30) Foreign Application Priority Data
Mar. 30, 2017  (CN) .......................... 2017 1 0204719

(51) Int. Cl.
*H01L 21/00* (2006.01)
*H01L 27/12* (2006.01)
*G02F 1/13* (2006.01)
*H01L 29/786* (2006.01)

(52) U.S. Cl.
CPC ............ *H01L 27/1262* (2013.01); *G02F 1/13* (2013.01); *H01L 27/124* (2013.01); *H01L 29/78633* (2013.01)

(58) Field of Classification Search
None
See application file for complete search history.

(56) References Cited

U.S. PATENT DOCUMENTS

2016/0328058 A1*  11/2016  Peng ..................... G06F 3/0412
2017/0047352 A1    2/2017  Wang
2017/0221928 A1    8/2017  Wang et al.
2018/0260058 A1*   9/2018  Zhan .................. G02F 1/13338
2018/0286938 A1*  10/2018  Moon ................. H01L 27/3262
2018/0292934 A1*  10/2018  Xu .......................... G06F 3/044
(Continued)

FOREIGN PATENT DOCUMENTS

CN          103151388       6/2013
CN          105118808      12/2015
(Continued)

*Primary Examiner* — Angel Roman

(57) ABSTRACT

A method for manufacturing an array substrate and an array substrate are provided, which include a first insulating for forming a gate, a scan line, a first data line, and a second data line of the thin film transistor, wherein the first data line and the second data line are located near both sides of the scan line, and are not electrically connected with the scan line, and a second insulating layer for forming a source, a drain, a connecting line, and a touch signal line of the thin film transistor, wherein the connecting line is configured to electrically connect the first data line with the second data line.

20 Claims, 3 Drawing Sheets

(56) References Cited

U.S. PATENT DOCUMENTS

2018/0335916 A1   11/2018  Hao
2019/0041915 A1*  2/2019  Park .................... H01L 27/3276
2019/0164995 A1*  5/2019  Lee ....................... H01L 27/124

FOREIGN PATENT DOCUMENTS

| CN | 106168865 | 11/2016 |
| CN | 106200077 | 12/2016 |
| CN | 106201114 | 12/2016 |

* cited by examiner

METHOD FOR MANUFACTURING ARRAY SUBSTRATE AND ARRAY SUBSTRATE

RELATED APPLICATIONS

This application is a National Phase of PCT Patent Application No. PCT/CN2017/082813 having International filing date of May 3, 2017, which claims the benefit of priority of Chinese Patent Application No. 201710204719.0 filed on Mar. 30, 2017. The contents of the above applications are all incorporated by reference as if fully set forth herein in their entirety.

FIELD AND BACKGROUND OF THE INVENTION

The present disclosure relates to the technical field of displays, and particularly to an array substrate and a method for manufacturing an array substrate.

Common electrodes in the effective display region are divided into small blocks as touch electrodes in the incell touch technique. Each of the touch electrodes has a touch signal line electrically connected with a touch chip for receiving touch signals.

Refer to FIG. 1, which is a structural schematic diagram of an existing array substrate. As shown in FIG. 1, in the manufacturing process of the existing array substrate, the active layer is disposed on a substrate 101 to form a conductive channel 102 of a thin film transistor. A first insulating layer 103 and the first metal layer are successively disposed on the active layer to form a gate 104 and a scan line 105 of the thin film transistor. The second insulating layer 106 is disposed on the first metal layer, followed by disposing the second metal layer on the second insulating layer to form a source 107, a drain 108, and a data line 109 of the thin film transistor, followed by sequentially disposing an organic planarization layer 110 and a third metal layer to form a touch signal line 111. A third insulating layer 112 and a fourth metal layer are sequentially disposed on the third metal layer to form a touch electrode 113. A fourth insulating layer 114 and a fifth metal layer are sequentially disposed on the fourth metal layer to form a pixel electrode 115. The pixel electrode 115 is electrically connected with the drain 108 of the thin film transistor via a first through hole 116, and the touch electrode 113 is electrically connected with the touch signal line 111 via a second through hole 117.

Thus, in order to dispose the touch signal line 111, in the manufacturing process of the array substrate, a metal manufacturing process and the third metal layer are added, increasing the cost of production and reducing the yield of the products.

Therefore, it is necessary to provide an array substrate and a method for manufacturing an array substrate to solve the existing problem of the prior art.

SUMMARY OF THE INVENTION

A primary object of the present disclosure is to provide a method for manufacturing an array substrate and an array substrate to simplify the manufacturing process, thereby saving the cost, and improving the yield of the products and the market competitiveness.

A method for manufacturing an array substrate is provided of the present disclosure. The method comprises steps of:

providing a substrate;

disposing an active layer on the substrate to form a conductive channel of a thin film transistor;

disposing a first insulating layer on the active layer;

disposing a first metal layer on the first insulating layer to form a gate, a scan line, a first data line, and a second data line of the thin film transistor; wherein the first data line and the second data line are located near both sides of the scan line, and are not electrically connected with the scan line;

disposing a second insulating layer on the first metal layer;

disposing a second metal layer on the second insulating layer to form a source, a drain, a connecting line, and a touch signal line of the thin film transistor; wherein the connecting line is configured to electrically connect the first data line with the second data line;

disposing an organic planarization layer on the second metal layer;

disposing a third metal layer on the organic planarization layer to form a touch electrode, wherein the touch electrode is electrically connected with the touch signal line;

disposing a third insulating layer on the third metal layer;

disposing a fourth metal layer on the third insulating layer to form a pixel electrode, wherein the pixel electrode is electrically connected to the drain of the thin film transistor;

wherein a first through hole and a second through hole are disposed on the second insulating layer, the connecting line is electrically connected with the first data line using the first through hole, and the connecting line is electrically connected with the second data line using the second through hole; and wherein the source of the thin film transistor is electrically connected with one end of the conductive channel of the thin film transistor using a third through hole, and the drain of the thin film transistor is electrically connected with other end of the conductive channel of the thin film transistor using the fourth through hole.

In the method for manufacturing the array substrate of the present disclosure, both the third through hole and the fourth through hole pass through the first insulating layer and the second insulating layer.

In the method for manufacturing the array substrate of the present disclosure, the pixel electrode is electrically connected with the drain of the thin film transistor using a fifth through hole.

In the method for manufacturing the array substrate of the present disclosure, the fifth through hole passes through the third insulating layer, the third metal layer, and the organic planarization layer.

In the method for manufacturing the array substrate of the present disclosure, the touch electrode is electrically connected with the touch signal line using a sixth through hole.

In the method for manufacturing the array substrate of the present disclosure, the sixth through hole passes through the organic planarization layer.

In the method for manufacturing the array substrate of the present disclosure, before the step of disposing the active layer on the substrate to form the conductive channel of the thin film transistor, the method further comprises: a step of forming a shading layer and a fourth insulating layer sequentially on the substrate.

A method for manufacturing an array substrate is provided of the present disclosure. The method for manufacturing the array substrate comprises steps of:

providing a substrate;

disposing an active layer on the substrate to form a conductive channel of a thin film transistor;

disposing a first insulating layer on the active layer;

disposing a first metal layer on the first insulating layer to form a gate, a scan line, a first data line, and a second data line of the thin film transistor; wherein the first data line and the second data line are located near both sides of the scan line, and are not electrically connected with the scan line;

disposing a second insulating layer on the first metal layer;

disposing a second metal layer on the second insulating layer to form a source, a drain, a connecting line, and a touch signal line of the thin film transistor; wherein the connecting line is configured to electrically connect the first data line with the second data line;

disposing an organic planarization layer on the second metal layer;

disposing a third metal layer on the organic planarization layer to form a touch electrode, wherein the touch electrode is electrically connected with the touch signal line;

disposing a third insulating layer on the third metal layer; and disposing a fourth metal layer on the third insulating layer to form a pixel electrode, wherein the pixel electrode is electrically connected to the drain of the thin film transistor.

In the method for manufacturing the array substrate of the present disclosure, a first through hole and a second through hole are disposed on the second insulating layer, the connecting line is electrically connected with the first data line using the first through hole, and the connecting line is electrically connected with the second data line using the second through hole.

In the method for manufacturing the array substrate of the present disclosure, the source of the thin film transistor is electrically connected with one end of the conductive channel of the thin film transistor using a third through hole, and the drain of the thin film transistor is electrically connected with other end of the conductive channel of the thin film transistor using the fourth through hole.

In the method for manufacturing the array substrate of the present disclosure, both the third through hole and the fourth through hole pass through the first insulating layer and the second insulating layer.

In the method for manufacturing the array substrate of the present disclosure, the pixel electrode is electrically connected with the drain of the thin film transistor using a fifth through hole.

In the method for manufacturing the array substrate of the present disclosure, the fifth through hole extends through the third insulating layer, the third metal layer, and the organic planarization layer.

In the method for manufacturing the array substrate of the present disclosure, the touch electrode is electrically connected with the touch signal line using a sixth through hole.

In the method for manufacturing the array substrate of the present disclosure, the sixth through hole passes through the organic planarization layer.

In the method for manufacturing the array substrate, before the step of disposing the active layer on the substrate to form the conductive channel of the thin film transistor, the method further comprises: a step of forming a shading layer and a fourth insulating layer sequentially on the substrate.

An array substrate is provided of the present disclosure. The array substrate comprises:

a substrate;

an active layer disposed on the substrate to form a conductive channel of a thin film transistor;

a first insulating layer disposed on the active layer;

a first metal layer disposed on the first insulating layer to form a gate, a scan line, a first data line, and a second data line of the thin film transistor; wherein the first data line and the second data line are located near both sides of the scan line, and are not electrically connected with the scan line;

a second insulating layer disposed on the first metal layer;

a second metal layer disposed on the second insulating layer to form a source, a drain, a connecting line, and a touch signal line of the thin film transistor; wherein the connecting line is configured to electrically connect the first data line with the second data line;

an organic planarization layer disposed on the second metal layer;

a third metal layer disposed on the organic planarization layer to form a touch electrode, wherein the touch electrode is electrically connected with the touch signal line;

a third insulating layer disposed on the third metal layer; and a fourth metal layer disposed on the third insulating layer to form a pixel electrode, wherein the pixel electrode is electrically connected to the drain of the thin film transistor.

In the array substrate of the present disclosure, a first through hole and a second through hole are disposed on the second insulating layer, the connecting line is electrically connected with the first data line using the first through hole, and the connecting line is electrically connected with the second data line using the second through hole.

In the array substrate of the present disclosure, the source of the thin film transistor is electrically connected with one end of the conductive channel of the thin film transistor using a third through hole, and the drain of the thin film transistor is electrically connected with other end of the conductive channel of the thin film transistor using the fourth through hole.

In the array substrate of the present disclosure, the touch electrode is electrically connected with the touch signal line using a sixth through hole.

In the method for manufacturing the array substrate and the array substrate, the first metal layer is disposed on the first insulating layer to form the gate, the scan line, the first data line, and the second data line of the thin film transistor, and the second metal layer is disposed on the second insulating layer to form the source, the drain, the connecting line, and the touch signal line of the thin film transistor, wherein the connecting line is configured to electrically connect the first data line and the second data line, thereby simplifying the manufacturing process, saving the cost, and improving the yield of the products and the market competitiveness.

To make the present disclosure clearly understood, the preferred embodiments are given hereinafter and are to be described in detail with reference to the accompanying drawings.

BRIEF DESCRIPTION OF THE SEVERAL VIEWS OF THE DRAWINGS

The technical aspects of the present invention and other advantageous effects will be apparent through the following detailed description of the specific embodiment of the disclosure taken in conjunction with the accompanying drawings.

DESCRIPTION OF SPECIFIC EMBODIMENTS OF THE INVENTION

The technical means and the effects thereof will be described in further detail with reference to the preferred embodiments of the present disclosure and the accompanying drawings thereof. Obviously, the described embodiments are merely part of the present disclosure, rather than all embodiments. Based on embodiments in the present invention, all other embodiments obtained by a person of ordinary skill in the art without making creative work are within the scope of the present disclosure.

Figure 1:
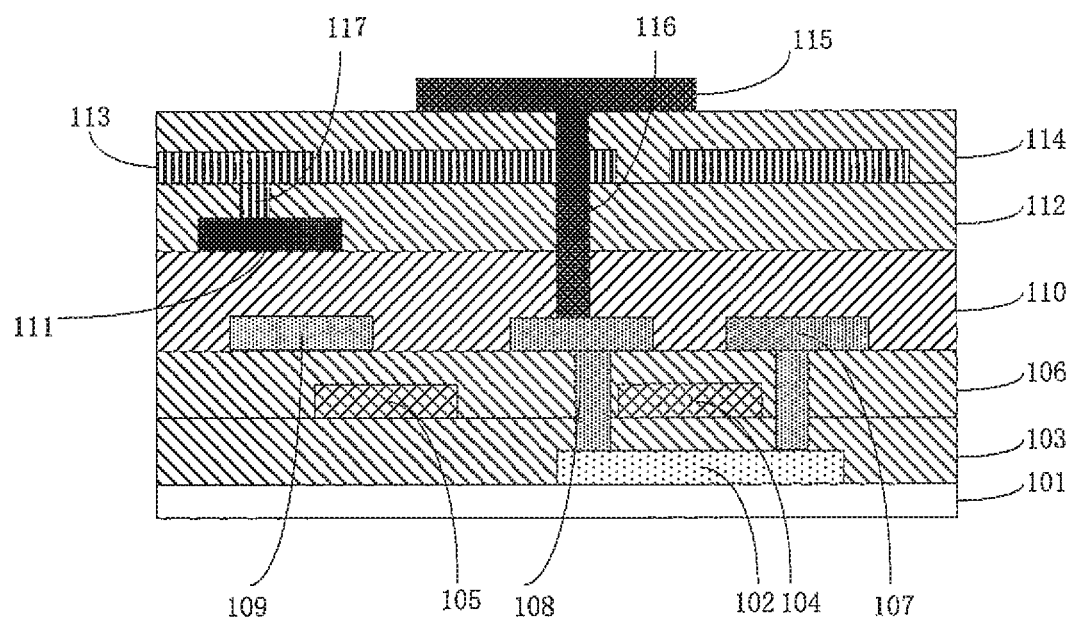
FIG. 1 is a structural schematic diagram of an existing array substrate.
Figure 2:
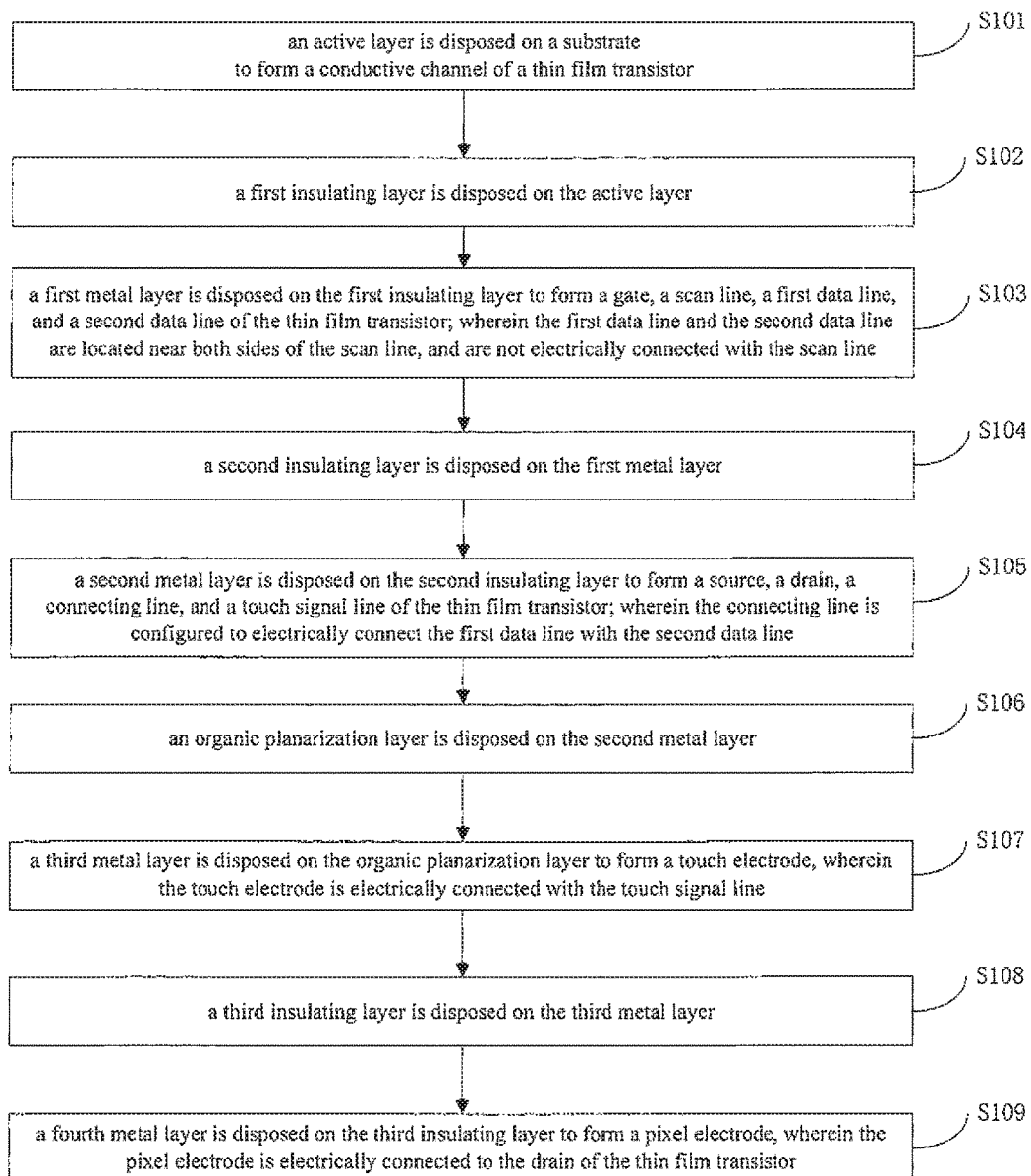
FIG. 2 is a schematic flow chart of the steps of the method for manufacturing an array substrate in accordance with a preferred embodiment of the present disclosure.

Refer to FIG. 2, which is a schematic flow chart of the steps of the method for manufacturing an array substrate in accordance with a preferred embodiment of the present disclosure. As shown in FIG. 2, the method of manufacturing the array substrate in accordance with the present preferred embodiment includes the following steps:

In step S101, an active layer is disposed on a substrate to form a conductive channel of a thin film transistor.

In step S102, a first insulating layer is disposed on the active layer.

In step S103, a first metal layer is disposed on the first insulating layer to form a gate, a scan line, a first data line, and a second data line of the thin film transistor; wherein the first data line and the second data line are located near both sides of the scan line, and are not electrically connected with the scan line.

In step S104, a second insulating layer is disposed on the first metal layer.

In step S105, a second metal layer is disposed on the second insulating layer to form a source, a drain, a connecting line, and a touch signal line of the thin film transistor; wherein the connecting line is configured to electrically connect the first data line with the second data line.

In step S106, an organic planarization layer is disposed on the second metal layer.

In step S107, a third metal layer is disposed on the organic planarization layer to form a touch electrode, wherein the touch electrode is electrically connected with the touch signal line.

In step S108, a third insulating layer is disposed on the third metal layer.

In step S109, a fourth metal layer is disposed on the third insulating layer to form a pixel electrode, wherein the pixel electrode is electrically connected to the drain of the thin film transistor.

In particular, in the method for manufacturing the array substrate in the present preferred embodiment, in order to prevent leakage of the thin film transistor in the display area of the array substrate, a shading layer is generally disposed under the conductive channel of the thin film transistor. A material used for the shading layer is metal. Thus, when the method for manufacturing the array substrate of the present disclosure is adopted, prior to the step S102, the method includes a step of forming a shading layer and a fourth insulating layer on the substrate. The fourth insulating layer is used for separating the shading layer from the active layer, so that the conductive channel is separated from the shading layer.

Figure 3:
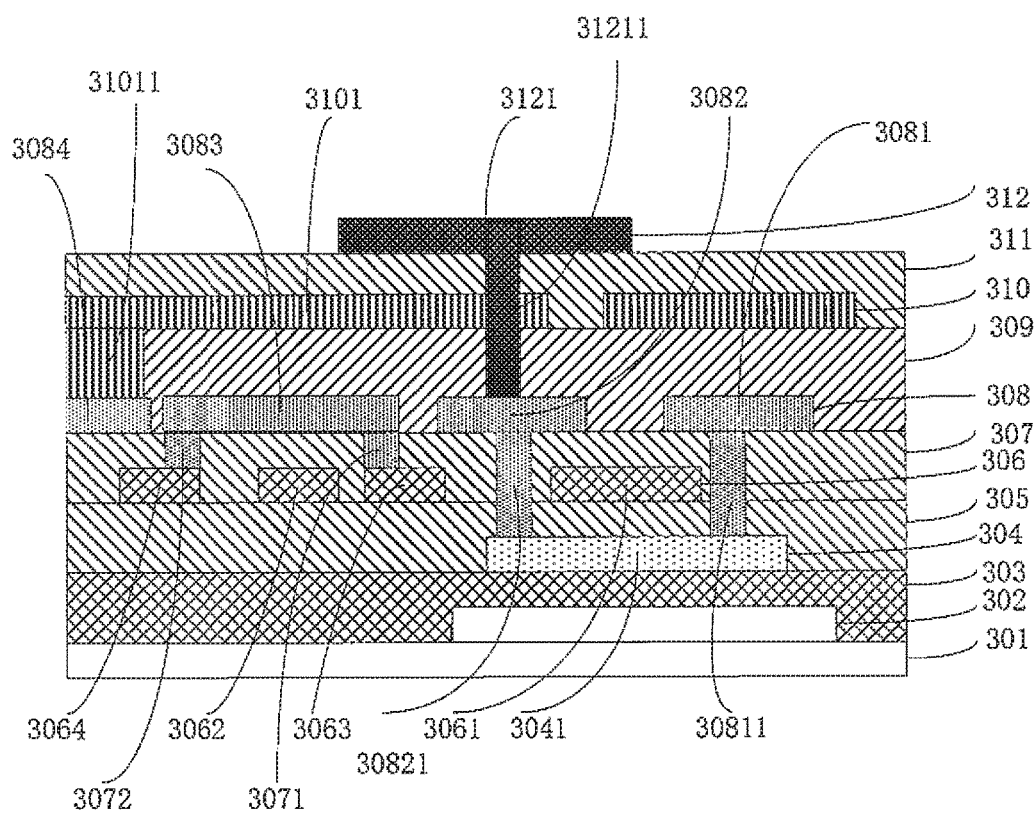
FIG. 3 is a structural schematic diagram of an array substrate manufactured by the method for manufacturing an array substrate in accordance with the preferred embodiment of the present disclosure.

Specifically, the structure of the array substrate formed by the method for manufacturing the array substrate in the present preferred embodiment will be described in detail below. Refer to FIG. 3, which is the structural schematic diagram of the array substrate manufactured by the method for manufacturing the array substrate in accordance with the preferred embodiment of the present disclosure. As shown in FIG. 3, the shading layer 302, the fourth insulation layer 303, the active layer 304, the first insulating layer 305, the first metal layer 306, the second insulating layer 307, the second metal layer 308, the organic planarization layer 309, the third metal layer 310, the third insulating layer 311, and the fourth metal layer 312 are sequentially formed on the substrate 301. The shading layer 302 is disposed on the bottom of the array substrate of the thin film transistor. The active layer 304 is patterned to form the conductive channel 3041 of the thin film transistor. The first metal layer 306 forms the gate 3061, the scan line 3062, the first data line 3063, and the second data line 3064 of the thin film transistor. The second metal layer 308 forms the source 3081, the drain 3082, the connecting line 3083 and the touch signal line 3084 of the thin film transistor. The third metal layer 310 forms the touch electrode 3101. The fourth metal layer 312 forms the pixel electrode 3121.

The difference between the present preferred embodiment and the prior art is that three metal layers are disposed to respectively form a data line, a scan line, and a touch signal line in the prior art, resulting in a complicated manufacturing process, and two metal layers are disposed to form a data line, a scan line, and a touch signal line in the method for manufacturing the array substrate in the present preferred embodiment, simplifying the process, and thereby saving the cost.

Specifically, the first metal layer 306 simultaneously forms the scan line 3062, the first data line 3063, and the second data line 3064, wherein the first data line 3063 and the second data line 3064 are located at both ends of the scan line 3062. In order to make the first data line 3063 and the second data line 3064 be electrically connected with each other, but not electrically connected with the scan line 3062, the second insulating layer 308 forms the connecting line 3083 to electrically connect the first data line 3063 with the second data line 3064. Moreover, the first through hole 3071 and the second through hole 3072 are defined in the second insulating layer 307, the connecting line 3083 is electrically connected with an end of the first data line 3063 using the first through hole 3071, and the connecting line 3083 is electrically connected with the other end of the second data line 3064 using the second through hole 3072. Furthermore, the second metal layer 308 also forms the touch signal line 3084, and the touch signal line 3084 is not electrically connected with the connecting line 3083. The aperture rate is increased by disposing the touch signal line 3084 in the black matrix region.

In addition, the source 3081 of the thin film transistor is electrically connected with one end of the conductive channel 3041 of the thin film transistor using the third through hole 30811, and the drain 3082 of the thin film transistor is electrically connected with the other end of the conductive channel 3041 of the thin film transistor using the fourth through hole 30821. Both the third through hole 30811 and the fourth through hole 30821 pass through the first insulating layer 305 and second insulating layer 307.

The pixel electrode 3121 is electrically connected with the drain 3082 of the thin film transistor using the fifth through hole 31211. The fifth through hole 31211 passes through the third insulating layer 311, the third metal layer 310 and the organic planarization layer 309.

The touch electrode 3101 is electrically connected with the touch signal line 3084 using the sixth through hole 31011. The sixth through hole 31011 passes through the organic planarization layer 309.

In the method for manufacturing the array substrate and the array substrate, the first metal layer is disposed on the first insulating layer to form the gate, the scan line, the first data line, and the second data line of the thin film transistor, and the second metal layer is disposed on the second insulating layer to form the source, the drain, the connecting line, and the touch signal line of the thin film transistor, wherein the connecting line is configured to electrically connect the first data line and the second data line, thereby simplifying the manufacturing process, saving the cost, and improving the yield of the products and the market competitiveness.

An array substrate is also provided of the present disclosure. The array substrate includes: a substrate; an active layer disposed on the substrate to form a conductive channel of a thin film transistor; a first insulating layer disposed on the active layer; a first metal layer disposed on the first insulating layer to form a gate, a scan line, a first data line, and a second data line of the thin film transistor; wherein the first data line and the second data line are located near both sides of the scan line, and are not electrically connected with the scan line; a second insulating layer disposed on the first metal layer; a second metal layer disposed on the second insulating layer to form a source, a drain, a connecting line, and a touch signal line of the thin film transistor; wherein the connecting line is configured to electrically connect the first data line with the second data line; an organic planarization layer disposed on the second metal layer; a third metal layer disposed on the organic planarization layer to form a touch electrode, wherein the touch electrode is electrically connected with the touch signal line; a third insulating layer disposed on the third metal layer; and a fourth metal layer disposed on the third insulating layer to form a pixel electrode, wherein the pixel electrode is electrically connected to the drain of the thin film transistor.

A first through hole and a second through hole are disposed on the second insulating layer, the connecting line is electrically connected with the first data line using the first through hole, and the connecting line is electrically connected with the second data line using the second through hole.

The source of the thin film transistor is electrically connected with one end of the conductive channel of the thin film transistor using a third through hole, and the drain of the thin film transistor is electrically connected with other end of the conductive channel of the thin film transistor using the fourth through hole.

The touch electrode is electrically connected with the touch signal line using a sixth through hole.

Both the third through hole and the fourth through hole pass through the first insulating layer and the second insulating layer.

The pixel electrode is electrically connected with the drain of the thin film transistor using a fifth through hole. The fifth through hole passes through the third insulating layer, the third metal layer, and the organic planarization layer.

The touch electrode is electrically connected with the touch signal line using a sixth through hole. The sixth through hole passes through the organic planarization layer.

Moreover, a shading layer and a fourth insulating layer are formed on the substrate.

The array substrate of the present disclosure is the same as the array substrate formed by the aforementioned method for manufacturing the array substrate. Specifically, refer to the description in the preferred embodiment of the aforementioned method for manufacturing the array substrate. The array substrate is not redundantly described herein.

In the method for manufacturing the array substrate and the array substrate, the first metal layer is disposed on the first insulating layer to form the gate, the scan line, the first data line, and the second data line of the thin film transistor, and the second metal layer is disposed on the second insulating layer to form the source, the drain, the connecting line, and the touch signal line of the thin film transistor, wherein the connecting line is configured to electrically connect the first data line and the second data line, thereby simplifying the manufacturing process, saving the cost, and improving the yield of the products and the market competitiveness.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A method for manufacturing an array substrate, comprising steps of:
   providing a substrate;
   disposing an active layer on the substrate to form a conductive channel of a thin film transistor;
   disposing a first insulating layer on the active layer;
   disposing a first metal layer on the first insulating layer to form a gate, a scan line, a first data line, and a second data line of the thin film transistor; wherein the first data line and the second data line are located near both sides of the scan line, and are not electrically connected with the scan line;
   disposing a second insulating layer on the first metal layer;
   disposing a second metal layer on the second insulating layer to form a source, a drain, a connecting line, and a touch signal line of the thin film transistor; wherein the connecting line is configured to electrically connect the first data line with the second data line;
   disposing an organic planarization layer on the second metal layer;
   disposing a third metal layer on the organic planarization layer to form a touch electrode, wherein the touch electrode is electrically connected with the touch signal line;
   disposing a third insulating layer on the third metal layer;
   disposing a fourth metal layer on the third insulating layer to form a pixel electrode, wherein the pixel electrode is electrically connected to the drain of the thin film transistor;
   wherein a first through hole and a second through hole are disposed on the second insulating layer, the connecting line is electrically connected with the first data line using the first through hole, and the connecting line is electrically connected with the second data line using the second through hole; and
   wherein the source of the thin film transistor is electrically connected with one end of the conductive channel of the thin film transistor using a third through hole, and the drain of the thin film transistor is electrically connected with other end of the conductive channel of the thin film transistor through the fourth through hole.

2. The method for manufacturing an array substrate as claimed in claim 1, wherein both the third through hole and the fourth through hole pass through the first insulating layer and the second insulating layer.

3. The method for manufacturing an array substrate as claimed in claim 1, wherein the pixel electrode is electrically connected with the drain of the thin film transistor using a fifth through hole.

4. The method for manufacturing an array substrate as claimed in claim 3, wherein the fifth through hole passes through the third insulating layer, the third metal layer, and the organic planarization layer.

5. The method for manufacturing an array substrate as claimed in claim 1, wherein the touch electrode is electrically connected with the touch signal line through a sixth through hole.

6. The method for manufacturing an array substrate as claimed in claim 1, wherein the sixth through hole passes through the organic planarization layer.

7. The method for manufacturing an array substrate as claimed in claim 1, wherein before the step of disposing the active layer on the substrate to form the conductive channel of the thin film transistor, the method further comprises:
   a step of forming a shading layer and a fourth insulating layer sequentially on the substrate.

8. A method for manufacturing an array substrate, comprising steps of:
   providing a substrate;
   disposing an active layer on the substrate to form a conductive channel of a thin film transistor;
   disposing a first insulating layer on the active layer;
   disposing a first metal layer on the first insulating layer to form a gate, a scan line, a first data line, and a second data line of the thin film transistor; wherein the first data line and the second data line are located near both sides of the scan line, and are not electrically connected with the scan line;
   disposing a second insulating layer on the first metal layer;
   disposing a second metal layer on the second insulating layer to form a source, a drain, a connecting line, and a touch signal line of the thin film transistor; wherein the connecting line is configured to electrically connect the first data line with the second data line;
   disposing an organic planarization layer on the second metal layer;
   disposing a third metal layer on the organic planarization layer to form a touch electrode, wherein the touch electrode is electrically connected with the touch signal line;
   disposing a third insulating layer on the third metal layer; and
   disposing a fourth metal layer on the third insulating layer to form a pixel electrode, wherein the pixel electrode is electrically connected to the drain of the thin film transistor.

9. The method for manufacturing an array substrate as claimed in claim 8, wherein a first through hole and a second through hole are disposed on the second insulating layer, the connecting line is electrically connected with the first data line using the first through hole, and the connecting line is electrically connected with the second data line using the second through hole.

10. The method for manufacturing an array substrate as claimed in claim 8, wherein the source of the thin film transistor is electrically connected with one end of the conductive channel of the thin film transistor using a third through hole, and the drain of the thin film transistor is electrically connected with other end of the conductive channel of the thin film transistor using the fourth through hole.

11. The method for manufacturing an array substrate as claimed in claim 10, wherein both the third through hole and the fourth through hole pass through the first insulating layer and the second insulating layer.

12. The method for manufacturing an array substrate as claimed in claim 8, wherein the pixel electrode is electrically connected with the drain of the thin film transistor using a fifth through hole.

13. The method for manufacturing an array substrate as claimed in claim 12, wherein the fifth through hole extends through the third insulating layer, the third metal layer, and the organic planarization layer.

14. The method for manufacturing an array substrate as claimed in claim 8, wherein the touch electrode is electrically connected with the touch signal line using a sixth through hole.

15. The method for manufacturing an array substrate as claimed in claim 14, wherein the sixth through hole passes through the organic planarization layer.

16. The method for manufacturing an array substrate as claimed in claim 8, wherein before the step of disposing the active layer on the substrate to form the conductive channel of the thin film transistor, the method further comprises:
   a step of forming a shading layer and a fourth insulating layer sequentially on the substrate.

17. An array substrate, comprising:
   a substrate;
   an active layer disposed on the substrate to form a conductive channel of a thin film transistor;
   a first insulating layer disposed on the active layer;
   a first metal layer disposed on the first insulating layer to form a gate, a scan line, a first data line, and a second data line of the thin film transistor; wherein the first data line and the second data line are located near both sides of the scan line, and are not electrically connected with the scan line;
   a second insulating layer disposed on the first metal layer;
   a second metal layer disposed on the second insulating layer to form a source, a drain, a connecting line, and a touch signal line of the thin film transistor; wherein the connecting line is configured to electrically connect the first data line with the second data line;
   an organic planarization layer disposed on the second metal layer;
   a third metal layer disposed on the organic planarization layer to form a touch electrode, wherein the touch electrode is electrically connected with the touch signal line;
   a third insulating layer disposed on the third metal layer; and
   a fourth metal layer disposed on the third insulating layer to form a pixel electrode, wherein the pixel electrode is electrically connected to the drain of the thin film transistor.

18. The array substrate as claimed in claim 17, wherein a first through hole and a second through hole are disposed on the second insulating layer, the connecting line is electrically connected with the first data line using the first through hole, and the connecting line is electrically connected with the second data line using the second through hole.

19. The array substrate as claimed in claim 17, wherein the source of the thin film transistor is electrically connected with one end of the conductive channel of the thin film transistor using a third through hole, and the drain of the thin film transistor is electrically connected with other end of the conductive channel of the thin film transistor using the fourth through hole.

20. The array substrate as claimed in claim 17, wherein the touch electrode is electrically connected with the touch signal line using a sixth through hole.

* * * * *